US009178176B2

United States Patent
Kim et al.

(10) Patent No.: US 9,178,176 B2
(45) Date of Patent: Nov. 3, 2015

(54) ORGANIC LIGHT EMITTING DISPLAY DEVICES AND METHODS OF MANUFACTURING ORGANIC LIGHT EMITTING DISPLAY DEVICES

(71) Applicant: Samsung Display Co., Ltd., Yongin, Gyeonggi-Do (KR)

(72) Inventors: Min-Seop Kim, Cheonan-si (KR); Hwan-Jin Kim, Hwaseong-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/496,539

(22) Filed: Sep. 25, 2014

(65) Prior Publication Data

US 2015/0084027 A1 Mar. 26, 2015

(30) Foreign Application Priority Data

Sep. 25, 2013 (KR) .................... 10-2013-0113614

(51) Int. Cl.
*H01L 35/24* (2006.01)
*H01L 51/00* (2006.01)
*H01L 51/52* (2006.01)

(52) U.S. Cl.
CPC .......... *H01L 51/5253* (2013.01); *H01L 51/529* (2013.01); *H01L 51/5237* (2013.01); *H01L 2227/323* (2013.01)

(58) Field of Classification Search
CPC ...... H01L 25/048; H01L 27/288; H01L 27/30; H01L 27/32; H01L 51/0032; H01L 51/50; H01L 2227/32; H01L 2251/50; H01L 27/3202; H01L 27/3204; H01L 27/3209; H01L 27/3225; H01L 27/3251; G09F 13/04
See application file for complete search history.

(56) References Cited

U.S. PATENT DOCUMENTS

| 2011/0242743 | A1 | 10/2011 | Moon |
| 2012/0163018 | A1* | 6/2012 | Lee ............................ 362/602 |
| 2012/0170244 | A1 | 7/2012 | Kwon et al. |
| 2013/0065071 | A1 | 3/2013 | Bonavoglia et al. |

FOREIGN PATENT DOCUMENTS

| KR | 10-2011-0049505 | 5/2011 |
| KR | 10-2011-0112124 | 10/2011 |
| KR | 10-2012-0079677 | 7/2012 |

* cited by examiner

*Primary Examiner* — Hoai V Pham
(74) *Attorney, Agent, or Firm* — Robert E. Bushnell, Esq.

(57) ABSTRACT

An organic light emitting display device may include a first cover, a protection member disposed on the first cover, a display panel disposed on the protection member, and a second cover disposed on the protection member. The protection member may include a plurality of layers having a plurality of pores, respectively. The protection member may reduce or remove a tolerance generated in manufacturing processes, and also may absorb or remove an external impact.

20 Claims, 11 Drawing Sheets

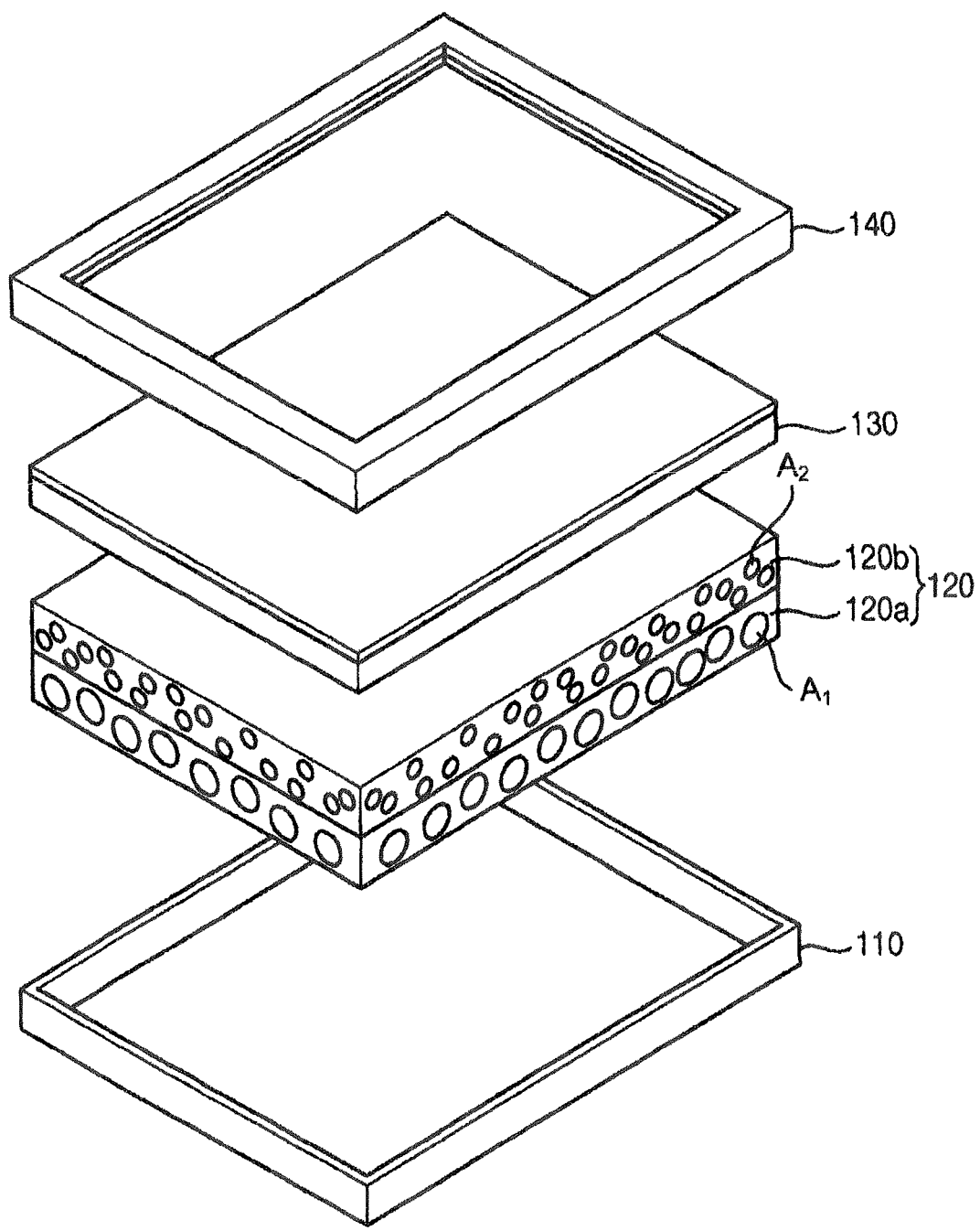

ORGANIC LIGHT EMITTING DISPLAY DEVICES AND METHODS OF MANUFACTURING ORGANIC LIGHT EMITTING DISPLAY DEVICES

CLAIM OF PRIORITY

This application makes reference to, incorporates the same herein, and claims all benefits accruing under 35 U.S.C. §119 from an application earlier filed in the Korean Intellectual Property Office on 25 Sep. 2013 and there duly assigned Serial No. 10-2013-0113614.

BACKGROUND OF THE INVENTION

1. Field of the Invention

Example embodiments of the invention relate to organic light emitting display devices and methods of manufacturing organic light emitting display devices. More particularly, example embodiments of the invention relate to organic light emitting display devices including protection members having a plurality of layers and methods of manufacturing the organic light emitting display devices.

2. Description of the Related Art

An organic light emitting display (OLED) device displays information such as images, letters and/or characters using light generated by combination of holes provided from an anode and electrons provided from a cathode in an organic layer. Because the organic light emitting display device has several advantageous such as relatively larger view angle, rapid response speed, smaller thickness, lower power consumption, etc., the organic light emitting display device becomes one of the prospecting next-generation display devices. Such organic light emitting display device may generally include a rear cover, a display panel, a front cover, etc.

As for the contemporary organic light emitting display device, a tolerance may be generated between the rear cover and the display panel during processes for manufacturing the organic light emitting display device, and thus the organic light emitting display device having the tolerance may be damaged by external impacts. Although the contemporary organic light emitting display device may include a buffer structure or a buffer layer such as a tape for absorbing the external impacts, the buffer structure and/or the buffer layer may not sufficiently protect the elements of the organic light emitting display device while still remaining the tolerance.

The above information disclosed in this Background section is only for enhancement of understanding of the background of the invention and therefore it may contain information that does not form the prior art that is already known in this country to a person of ordinary skill in the art.

SUMMARY OF THE INVENTION

Example embodiments provide an organic light emitting display device including a protection member having a plurality of layers containing a plurality of pores to reduce or remove external impacts and a tolerance generated in manufacturing processes.

Example embodiments provide a method of manufacturing the organic light emitting display device including a protection member having a plurality of layers containing a plurality of pores to reduce or remove external impacts and a tolerance generated in manufacturing processes.

According to one aspect of the invention, there is provided an organic light emitting display device including a first cover, a protection member, a display panel, and a second cover. The protection member may include a plurality of layers disposed on the first cover. The plurality of layers may have a plurality of pores, respectively. The display panel may be disposed on the protection member, and the second cover may be positioned on the protection member.

In example embodiments, the protection member may include a first layer having a plurality of first pores, and a second layer having a plurality of second pores. The second layer may be disposed on the first layer, and each of the second pores has second size different from first size. For example, the first layer may reduce or remove a tolerance between the first cover and the display panel generated in processes for manufacturing the organic light emitting display device, and the second layer may reduce or absorb external impacts applied to the display panel.

In some example embodiments, the protection member may additionally include a plurality of thermally conductive filers dispersed in the first layer and the second layer.

In other example embodiments, the protection member may additionally include a third layer having a plurality of third pores, the third layer disposed on a front surface of the second layer or a rear surface of the second layer. For example, each of the third sizes has a third size the same as the first size. In other example embodiments, the protection member may additionally include a plurality of thermally conductive filers dispersed in the third layer.

In example embodiments, the protection member may include at least one of silicon-based resin, rubber-based resin, acrylic-based resin, and urethane-based resin.

In some example embodiments, the organic light emitting display device may additionally include an electromagnetic wave shielding member disposed between the first cover and the protection member, the electromagnetic wave shielding member shielding an electromagnetic wave generated from the display panel. For example, the electromagnetic wave shielding member may include a conductive metal layer containing cupper (Cu), aluminum (Al), nickel (Ni), silver (Ag), iron (Fe), zinc (Zn), gold (Au), platinum (Pt), chrome (Cr), cadmium (Cd), tungsten (W), etc. These may be used alone or in a combination thereof.

In some example embodiments, the protection member may additionally include a plurality of thermally conductive filers, each of the thermally conductive filers dispersed in the plurality of layers, and the thermally conductive filers may emit a heat generated from the display panel into an outside. For example, each of the thermally conductive filers may include metal particles containing at least one of cupper (Cu), aluminum (Al), nickel (Ni), silver (Ag), iron (Fe), zinc (Zn), gold (Au), platinum (Pt), chrome (Cr), cadmium (Cd), tungsten (W), etc. These may be used alone or in a combination thereof.

According to another aspect of the invention, there is provided a method of manufacturing an organic light emitting display device. In the method, a first cover may be provided. A protection member having a plurality of layers may be formed on the first cover. A display panel may be formed on the protection member. A second cover may be formed on the display panel.

In example embodiments, forming the protection member may include forming a first liquid mixture including at least one of silicon-based resin, rubber-based resin, acrylic-based resin and urethane-based resin, forming a plurality of first pores having a first size in the first liquid mixture by providing a first non-reactive gas to the first liquid mixture, forming a first layer by hardening the first liquid mixture containing the first pores, forming a second liquid mixture at least one of the silicon-based resin, the rubber-based resin, the acrylic-based resin, and the urethane-based resin, forming a plurality of second pores having a second size different from the first size in the second liquid mixture by providing a second non-reactive gas to the second liquid mixture, forming a second layer by hardening the second liquid mixture containing the second pores, and combining the first layer and the second layer with each other.

In some example embodiments, forming the protection member may include dispersing first thermally conductive filers in the first liquid mixture, forming the first layer by hardening the first liquid mixture having the first thermally conductive filers and the first pores, dispersing second thermally conductive filers in the second liquid mixture, and forming the second layer by hardening the second liquid mixture having the second thermally conductive filers and the second pores.

In other example embodiments, forming the protection member may include forming a third liquid mixture including at least one of silicon-based resin, rubber-based resin, acrylic-based resin, and urethane-based resin, forming a plurality of third pores having a third size the same as the first size in the third liquid mixture by providing a third non-reactive gas to the third liquid mixture, forming a third layer by hardening the third liquid mixture containing the third pores, and adhering the third layer on the second layer.

In other example embodiments, forming the protection member may include forming a third liquid mixture including at least one of silicon-based resin, rubber-based resin, acrylic-based resin, and urethane-based resin, forming a plurality of third pores in the third liquid mixture by providing a third non-reactive gas to the third liquid mixture, forming a third layer by hardening the third liquid mixture containing the third pores, and adhering the third layer on a rear surface of the first layer.

In other example embodiments, forming the protection member may include dispersing third thermally conductive filers in the third liquid mixture, and forming the third layer by hardening the third liquid mixture containing the third fluid thermally conductive filers and the third pores.

In some example embodiments, an electromagnetic wave shielding member may be additionally formed between the first cover and the protection member. The electromagnetic wave shielding member may be additionally coated on a rear surface of the protection member. For example, the electromagnetic wave shielding member may include a conductive metal layer containing at least one of cupper, aluminum, nickel, silver, iron, zinc, gold, platinum, chrome, cadmium, tungsten, etc. These may be used alone or in a combination thereof.

According to example embodiments, the organic light emitting display device may include a protection member having a plurality of layers containing a plurality of pores. Thus, the organic light emitting display device may reduce or remove a tolerance generated in the manufacturing processes for the organic light emitting display device, and may efficiently absorb or reduce external impacts. Further, the organic light emitting display device may additionally include an electromagnetic wave shielding member. Thus, the organic light emitting display device may block an electromagnetic wave generated from the display panel to protect a user. Furthermore, a plurality of thermally conductive filers may be dispersed in the protection member. Thus, heat generated from the display panel may be dissipated more efficiently. Therefore, the organic light emitting display device may have improved reliability and durability.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 1 is an exploded perspective view illustrating an organic light emitting display device in accordance with example embodiments.

DETAILED DESCRIPTION OF THE EMBODIMENTS

Figure 2A:
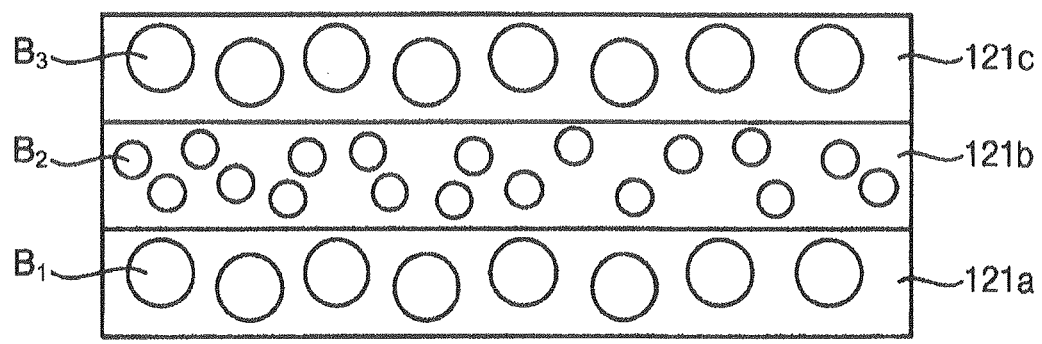
FIGS. 2A through 2E are cross-sectional views respectively illustrating protection members in accordance with example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is an exploded perspective view illustrating an organic light emitting display device in accordance with example embodiments.

In reference to FIG. 1, an organic light emitting display device 100 may include a first cover 110, a protection member 120, a display panel 130, a second cover 140, etc.

As illustrated in FIG. 1, the first cover 110 may be disposed behind the display panel 130 (e.g., beneath the display panel 130). The first cover 110 may receive the display panel 130. The first cover 110 may include a material having a relatively high strength. For example, the first cover 110 may include a stainless steel, magnesium (Mg), aluminum (Al), nickel (Ni), etc. Alternatively, the first cover 110 may include a flexible material. Examples of the flexible material for the first cover 110 may include polyimide-based resin, acryl-based resin, polyacrylate-based resin, polycarbonate-based resin, polyether-based resin, sulfonic acid-based resin, polyethyleneterephthalate-based resin, etc.

The protection member 120 may be disposed between the first cover 110 and the display panel 130. The protection member 120 may protect the first cover 110 and/or the display panel 130 from external impacts. Furth, the protection member 120 may ensure a reduced tolerance generated in manufacturing processes for the organic light emitting display device 100, so that, the display panel 130 may be accurately disposed between the first cover 110 and the second cover 120 by the protection member 120. Therefore, damage to the organic light emitting display device 100 caused by the tolerance may be effectively prevented.

The protection member 120 may include a material having a relatively lower strength than that of the first cover 110 and/or that of the display panel 130. For example, the protection member 120 may include at least one of silicon-based resin, rubber-based resin, acrylic-based resin, and urethane-based resin. These may be used alone or in a combination thereof.

In example embodiments, the protection member 120 may include a plurality of layers. Here, each of the layers may have a plurality of pores. The protection member 120 may include a first layer 120a having a plurality of first pores $A_1$ and a second layer 120b having a plurality of second pores $A_2$ as illustrated in FIG. 1. The second layer 120b may be disposed on the first layer 120a. In example embodiments, second sizes of the second pores $A_2$ may be substantially smaller than first sizes of the first pores $A_1$, respectively. Further, the number of the second pores $A_2$ may be substantially larger than the number of the first pores $A_1$. However, the sizes and the numbers of the first pores $A_1$ and the second pores $A_2$ may vary in accordance with the dimensions of the protection member 120, dimensions of the display panel 130, etc.

As illustrated in FIG. 1, when the first layer 120a includes the plurality of first pores $A_1$, the first pores $A_1$ may be substantially irregularly dispersed in the first layer 120a. In addition, the second pores $A_2$ may be substantially irregularly dispersed in the second layer 120b. When the protection member 120 includes the first layer 120a having the first pores $A_1$ and the second layer 120b having the second pores $A_2$, a density of the protection member 120 may be substantially smaller than a density of the conventional buffer material (or layer) or the conventional protection material (or layer). Accordingly, the protection member 120 may protect the first cover 110 and/or the display panel 130 from the external impact, and also may efficiently adjust a distance between the first cover 110 and the display panel 130. Therefore, the protection member 120 may efficiently protect the first cover 110 and/or the display panel 130, and may reduce or remove a tolerance generated in the processes for manufacturing the organic light emitting display device 100.

As for the protection member 120 according to example embodiments, a first thickness of each first layer 120a may be substantially the same as a second thickness of each second layer 120b. Alternatively, the first thickness of the first layer 120a may be different from the second thickness of the second layers 120b in accordance with kinds of the external impacts (e.g., a front impact, a side impact, etc). The first layer 120a may include a material substantially the same as that of the second layer 120b. However, the first layer 120a may include a material different from a material in the second layer 120b. In case that the material of the first layer 120a may be substantially the same as the material of the second layer 120b, the first layer 120a may be integrally formed with the second layer 120b. When the material of the first layer 120a may be different from the material of the second layer 120b, the first layer 120a may be combined with the second layer 120b.

The conventional buffer material (or layer) or the conventional protection material (or layer) has a single layer structure containing pores, so that the conventional buffer material or the conventional protection material may hardly absorb or reduce the external impacts applied to the display panel, thereby causing damages to the organic light emitting display device. Further, the conventional buffer material or the conventional protection material may not properly reduce or remove a tolerance between the rear cover and the display panel generated in the processes for manufacturing the organic light emitting display device to thereby damage to the organic light emitting display device. In consideration of these problems, the protection member 120 according to example embodiments of the instant invention may include the first layer 120a having the first pores $A_1$ and the second layer 120b having the second pores $A_2$. By employing the protection member 120 having such a configuration, the first cover 110 and/or the display panel 130 may be effectively protected from the external impacts. Additionally, the protection member 120 may properly adjust a distance between the first cover 110 and the display panel 130, such that the protection member 120 may effectively reduce or remove the tolerance generated between the first cover 110 and the display. As a result, damages to the organic light emitting display device 100 may be efficiently prevented by the protection member 120.

The protection member 120 illustrated in FIG. 1 may include the two layers 120a and 120b. However, the number of layers of the protection member 120 may not be limited thereto. For example, the protection member 120 may include a first layer to an Nth layer in accordance with the types of the external impacts or the tolerance generated in the manufacturing processes. Here, N is an integer greater than or equal to 3.

FIGS. 2A through 2E are cross-sectional views respectively illustrating protection members in accordance with example embodiments.

As illustrated in FIG. 2A, a protection member 121 may include a first layer 121a, a second layer 121b, and a third layer 121c. In this case, the first layer 121a may include a plurality of first pores $B_1$ having first sizes, and the second layer 121b disposed on the first layer 121b may include a plurality of second pores $B_2$ having second sizes substantially smaller than the first sizes. In addition, the third layer 121c disposed on the second layer 121b may include a plurality of third pores $B_3$ having third sizes substantially the same as the first sizes. The first pores $B_1$, the second pores $B_2$ and the third pores $B_3$ may be substantially irregularly dispersed in the first layer 121a, the second layer 121b, and the third layer 121c, respectively. When the protection member 121 includes a structure having the three layers 121a, 121b and 121c, the protection member 121 may more effectively reduce or remove external impacts, so that the protection member 121 may more efficiently protect the first cover 110 and/or the display panel 130. For example, the protection member 121 illustrated in FIG. 2A may protect the first cover 110 and/or the display panel 130 from front impacts applied from an outside.

Figure 2B:
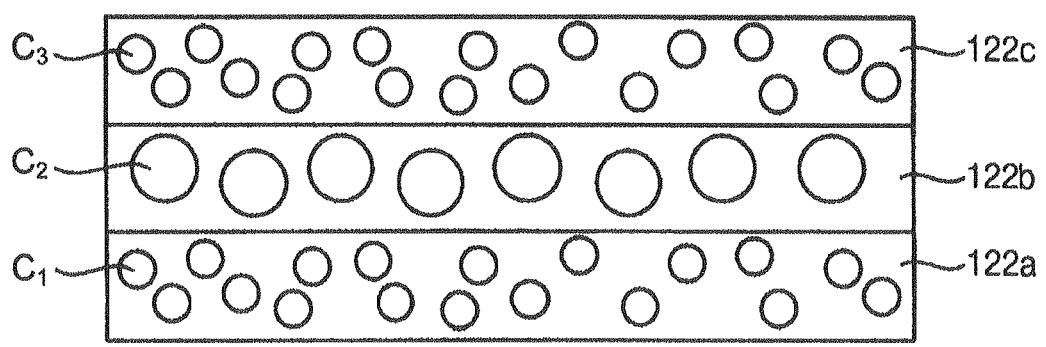

A protection member 122 illustrated in FIG. 2B may include a first layer 122a, a second layer 122b and a third layer 122c. In this case, the first layer 122a may include a plurality of first pores $C_1$ each of which has a first size. The second layer 122b disposed on the first layer 122a may include a plurality of second pores $C_2$ each of which has a second size substantially larger than the first size. Further, the third layer 122c disposed on the second layer 122b may include a plurality of third pores $C_3$ each of which has a third size substantially the same as the first size. The first pores $C_1$, the second pores $C_2$ and the third pores $C_3$ may be substantially irregularly dispersed in the first layer 122a, the second layer 122b and the third layer 122c, respectively. In case that the protection member 122 includes a structure having the three layers 122a, 122b and 122c, the protection member 122 may more effectively reduce or remove side impacts applied from the outside. Accordingly, the first cover 110 and/or the display panel 130 may be more efficiently protected from the side impacts.

Figure 2C:
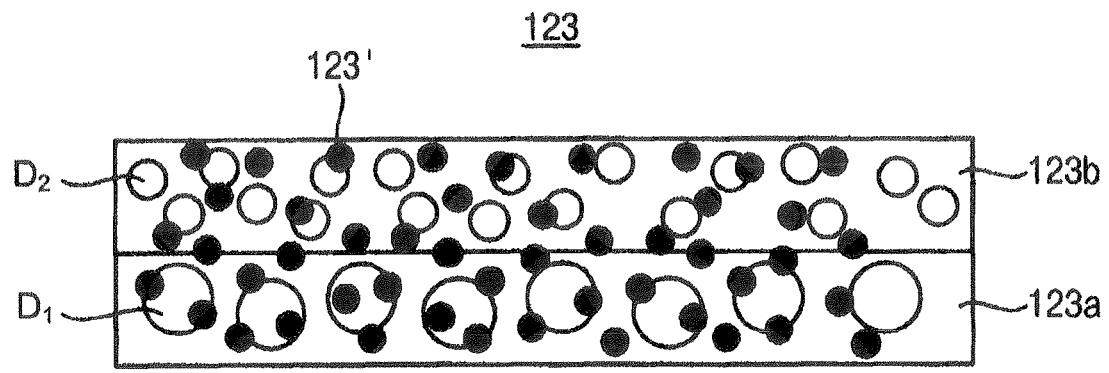

As illustrated in FIG. 2C, a protection member 123 having a first layer 123a and a second layer 123b may additionally include a plurality of thermally conductive filers 123'. The thermally conductive filers 123' may emit heat generated from a display panel 130 to the exterior of the display device during the operation of an organic light emitting display device 100. Here, the thermally conductive filers 123' may be entirely irregularly dispersed in the protection member 123. That is, the thermally conductive filers 123' may be substantially entirely dispersed in the first layer 120a and the second layer 123b. For example, each of the thermally conductive filers 123' may include metal particles containing cupper (Cu), aluminum (Al), nickel (Ni), silver (Ag), iron (Fe), zinc (Zn), gold (Au), platinum (Pt), chrome (Cr), cadmium (Cd) and/or tungsten (W). These may be used alone or in a combination thereof. As for the protection member 123 illustrated in FIG. 2C, the first layer 123a having a plurality of first pores $D_1$ may reduce or remove the tolerance generated in the manufacturing processes for the organic light emitting display device 100. In addition, the second layer 123b having a plurality of pores $D_2$ may reduce or absorb external impacts applied to the display panel 130. Furthermore, the heat generated by and transferred from the display panel 130 may be dissipated more efficiently by the thermally conductive filers 123' dispersed in the first layer 123a and the second layer 123b. Therefore, the organic light emitting display device 100 may have improved reliability and durability.

Figure 2D:
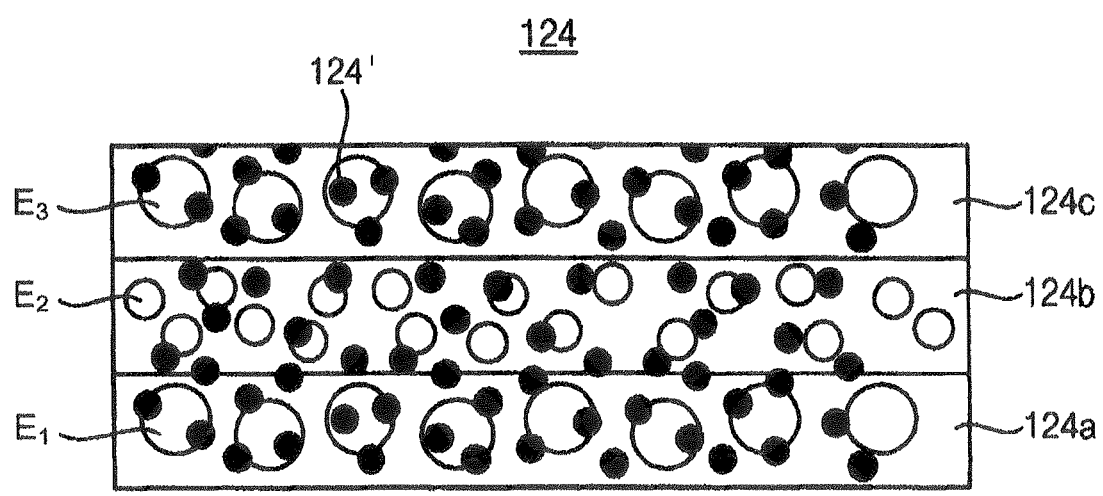

A protection member 124 illustrated in FIG. 2D may include a first layer 124a having a plurality of first pores $E_1$ of first sizes, a second layer 124b having a plurality of second pores $E_2$ of second sizes substantially smaller than the first sizes, and a third layer 124c having a plurality of third pores $E_3$ of third sizes substantially the same as the first sizes. In this case, the protection member 124 may additionally include a plurality of thermally conductive filers 124' entirely dispersed in the protection member 124. The protection member 124 illustrated in FIG. 2D may reduce or remove a tolerance generated in the manufacturing process for the organic light emitting display device 100, and may efficiently absorb or reduce external impacts (e.g., front impacts) applied to the display panel 130. Further, the heat generated by and transferred from the display panel 130 may be dissipated more efficiently by the thermally conductive filers 124' entirely dispersed in the first layer 124a, the second layer 124b, and the third layer 124c. As a result, the organic light emitting display device 100 may ensure enhanced reliability and durability.

Figure 2E:
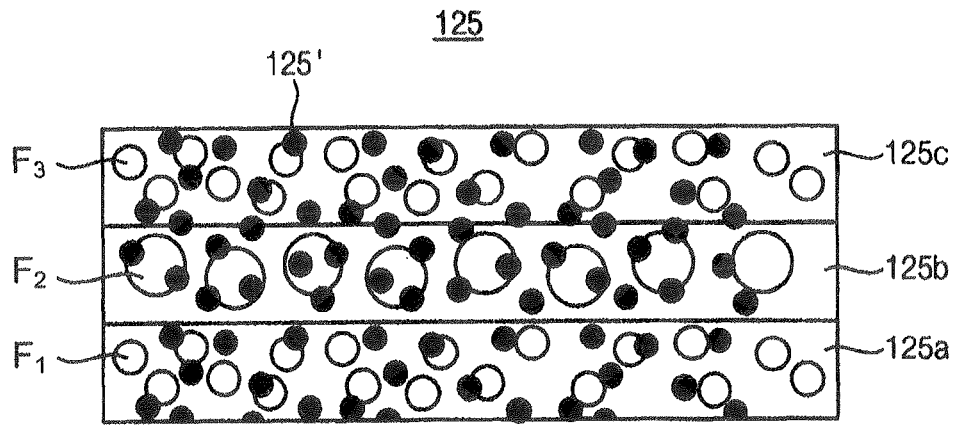

As illustrated in FIG. 2E, a protection member 125 may include a first layer 125a having a plurality of first pores $F_1$ of first sizes, a second layer 125b having a plurality of second pores $F_2$ of second sizes substantially larger than the first sizes, and a third layer 125c having a plurality of third pores $F_3$ of third sizes substantially the same as the first sizes. Here, the protection member 125 may additionally include a plurality of thermally conductive filers 125' entirely dispersed in the first layer 125a, the second layer 125b and the third layer 125c, respectively. Thus, when external impacts (e.g., side impacts) are applied to the display panel 130, the external impacts may be efficiently reduced or absorbed by the protection member 125 illustrated in FIG. 2E. Further, the first layer 125a, the second layer 125b and the third layer 125c may reduce or remove a tolerance generated in manufacturing processes for the organic light emitting display device 100 while efficiently dissipating a heat generated from a display panel 130 through the thermally conductive filers 125' dispersed in the first layer 125a, the second layer 125b and the third layer 125c.

Now in reference to FIG. 1, the display panel 130 may be disposed on the protection member 120. The display panel 130 may include switching elements, wirings, insulation layers, organic light emitting structures, etc. Such configuration of the display panel 130 will be described below. In some example embodiments, the display panel 130 may include a liquid crystal layer interposed between electrodes thereof instead of the organic light emitting structures.

The second cover 140 may be disposed in front of the display panel 130, and may be combined with the first cover 110 by interposing the display panel 130 therebetween. The second cover 140 may include a material having a relatively high strength. For example, the second cover 140 may include stainless steel, magnesium, aluminum, nickel, etc. Alternatively, the second cover 140 may include a flexible material. For example, the second cover 140 may include polyimide-based resin, acryl-based resin, polyacrylate-based resin, polycarbonate-based resin, polyether-based resin, sulfonic acid-based resin, polyethyleneterephthalate-based resin, etc.

Figure 3:
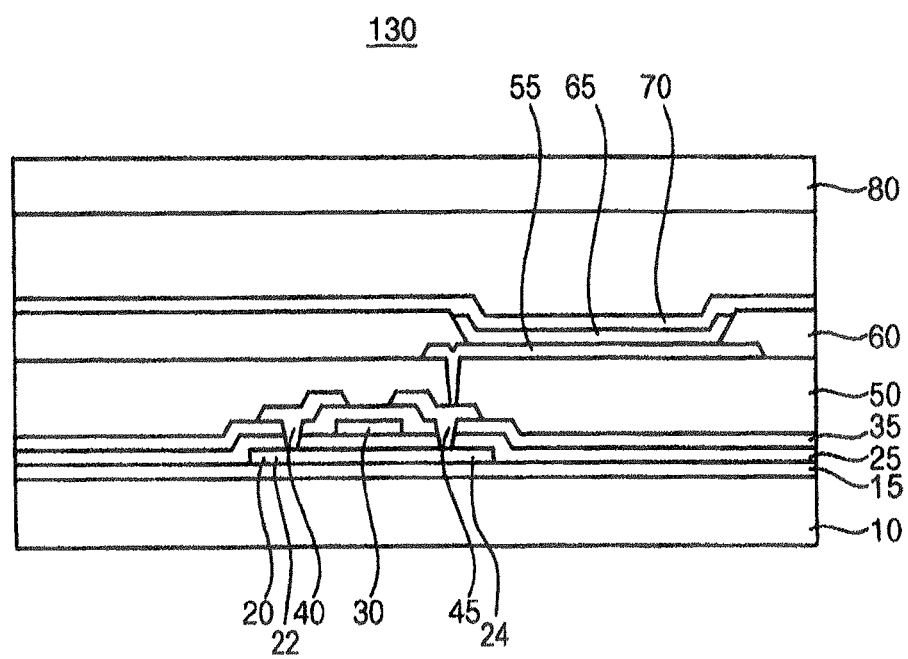
FIG. 3 is a cross-sectional view illustrating a display panel of an organic light emitting display device in accordance with example embodiments.

FIG. 3 is a cross-sectional view illustrating a display panel of an organic light emitting display device in accordance with example embodiments.

In reference to FIG. 3, a display panel 130 may include a first substrate 10, a switching element, a first electrode 55, an organic light emitting structure 65, a second electrode 70, a second substrate 80, etc.

A buffer layer 15 may be disposed on the first substrate 10. The first substrate 10 may include a transparent insulation material. For example, the first substrate 10 may include a glass substrate, a quartz substrate, a transparent resin substrate, etc.

The buffer layer 15 may prevent diffusion of metal atoms and/or impurities from the first substrate 10. Further, the buffer layer 10 may adjust a heat transfer rate in a successive crystallization process for an active pattern 20, thereby obtaining a substantially uniform active pattern 20. In case that the first substrate 10 has a relatively irregular surface, the buffer layer 10 may improve a flatness of the surface of the first substrate 10. The buffer layer 15 may be formed using a silicon mixture.

The switching element may be disposed on the buffer layer 15. The switching element may include a thin film transistor (TFT) having the active pattern 20 that may contain silicon (Si). For example, the switching element may include the active pattern 20, a gate insulation layer 25, a gate electrode 30, a source electrode 40, a drain electrode 45, etc. Alternatively, the switching element may include an oxide semiconductor device having an active pattern that may contain semiconductor oxide.

When the switching element includes the TFT, the active pattern 20 may be disposed on the buffer layer 15. The active pattern 20 may include a source region 22 and a drain region 24 both of which are doped with impurities. The active pattern 20 may include a channel region 26 formed between the source region 22 and the drain region 24.

The gate insulation layer 25 may be disposed on the buffer layer 15 to cover the active pattern 20. The gate insulation layer 25 may include silicon oxide, metal oxide, etc. Examples of metal oxide for the gate insulation layer 25 may include hafnium oxide (HfOx), aluminum oxide (AlOx), zirconium oxide (ZrOx), titanium oxide (TiOx), tantalum oxide (TaOx), etc. These may be used alone or in a combination thereof.

The gate electrode 30 may be located on the gate insulation layer 25. For example, the gate electrode 30 may locate on a portion of the gate insulation layer 25 under which the active pattern 20 is positioned. The gate electrode 30 may include metal, alloy, conductive metal oxide, a transparent conductive material, etc. For example, the gate electrode 30 may be formed using aluminum (Al), alloy containing aluminum, aluminum nitride (AlNx), silver (Ag), alloy containing silver, tungsten (W), tungsten nitride (WNx), copper (Cu), alloy containing copper, nickel (Ni), alloy containing nickel, chrome (Cr), chrome nitride (CrNx), molybdenum (Mo), alloy containing molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), etc. These may be used alone or in a combination thereof. A gate line (not illustrated) may be disposed on the gate insulation layer 25. The gate electrode 30 may be electrically connected to the gate line. Here, the gate line may extend along a first direction on the gate insulation layer 25.

An insulating interlayer 35 may be disposed on the gate insulation layer 25 to cover the gate electrode 30. The insulating interlayer 35 may electrically insulate the source and the drain electrodes 40 and 45 from the gate electrode 30. The insulating interlayer 35 having a substantially uniform thickness may be conformally formed on the gate insulation layer 25 along a profile of the gate electrode 30. The insulating interlayer 35 may be formed using a silicon mixture. For example, the insulating interlayer 35 may include silicon oxide, silicon nitride, silicon oxynitride, silicon oxycarbide and/or silicon carbon nitride. These may be used alone or in a mixture thereof.

As illustrated in FIG. 3, the source electrode 40 and the drain electrode 45 may be disposed on the insulating interlayer 35. The source and the drain electrodes 40 and 45 may be separated from each other substantially centering the gate electrode 30 by a predetermined distance. The source and the drain electrodes 40 and 45 may pass through the insulating interlayer 35, and may make contact with the source and the drain regions 22 and 24, respectively. Each of the source and the drain electrodes 40 and 45 may include metal, alloy, metal nitride, conductive metal oxide, a transparent conductive material, etc. For example, each of the source and the drain electrodes 40 and 45 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. Although it is not illustrated in FIG. 3, a data line may be formed on the insulating interlayer 35 while forming the source and the drain electrodes 40 and 45. The data line may extend on the insulating interlayer 35 along a second direction. In this case, the second direction of the date line may be substantially perpendicular to the first direction of the gate line.

As formation of the source and the drain electrodes 40 and 45 on the insulating interlayer 35, the switching device may be provided on the first substrate 10. The switching device may include the TFT that may have the active pattern 20, the gate insulation layer 25, the gate electrode 30, the source electrode 40 and the drain electrode 45.

An insulation layer 50 may be disposed on the insulating interlayer 35 to cover the source electrode 40 and the drain electrode 45. The insulation layer 50 may be formed using an organic material. For example, the insulation layer 50 may include photoresist, acryl-based resin, polyimide-based resin, polyamide-based resin, siloxane-based resin, etc. These may be used alone or in a combination thereof. Alternatively, the insulation layer 50 may include an inorganic material. For example, the insulation layer 50 may be formed using silicon oxide, silicon nitride, silicon oxynitride, silicon oxycarbide, aluminum, magnesium, zinc, hafnium, zirconium, titanium, tantalum, aluminum oxide, titanium oxide, tantalum oxide, magnesium oxide, zinc oxide, hafnium oxide, zirconium oxide, titanium oxide, etc. These may be used alone or in a mixture thereof.

In reference now to FIG. 3, the first electrode 55 may locate on the insulation layer 50 and may make contact with the drain electrode 45 through the insulation layer 50. The first electrode 55 may include a reflective material or a transmissive material. For example, the first electrode 55 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof.

A pixel defining layer 60 may be disposed on the first electrode 55 and the insulation layer 50. The pixel defining layer 60 may include an organic material or an inorganic material. For example, the pixel defining layer 60 may be formed using photoresist, acryl-based resin, polyacryl-based resin, polyimide-based resin, a silicon mixture, etc. The pixel defining layer 60 may have an opening partially exposing the first electrode 55. The pixel defining layer 60 having the opening may define a display region and a non-display region of the organic light emitting display device. For example, the display region may correspond to a portion of the pixel defining layer 60 where the opening locates, and the non-display region may correspond a portion of the pixel defining layer 60 adjacent to the opening.

The organic light emitting structure 65 may locate on the first electrode 55 exposed by the opening of the pixel defining layer 60. The organic light emitting structure 65 may extend onto a sidewall of the opening of the pixel defining layer 60. In example embodiments, the organic light emitting structure 65 may include an organic light emitting layer (EL), a hole injection layer (HIL), a hole transfer layer (HTL), an electron transfer layer (ETL), an electron injection layer (EIL), etc. The organic light emitting layer of the organic light emitting structure 65 may include light emitting materials for generating different colors of light such as a red color of light (R), a green color of light (G) and a blue color of light (B) in accordance with color pixels of the organic light emitting display device 100. In some example embodiments, the organic light emitting layer of the of the organic light emitting structure 65 may include a plurality of stacked light emitting materials for generating a red color of light, a green color of light and a blue color of light, thereby emitting a white color of light.

The second electrode 70 may be disposed on the organic light emitting structure 65 and the pixel defining layer 60. The second electrode 70 may include a transmissive material or a reflective material in accordance with the type of the organic light emitting display device 100. For example, the second electrode 70 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof.

The second substrate 80 may locate on the second electrode 70. The second substrate 80 may include a transparent insulation substrate. For example, the second substrate 80 may include a glass substrate, a quartz substrate, a transparent resin substrate, etc. In example embodiments, a predetermined space may be provided between the second electrode 70 and the second substrate 80. This space may be filled with an air or an inactive gas such as a nitrogen ($N_2$) gas.

FIGS. 4 through 7 are perspective views illustrating a method of manufacturing an organic light emitting display device in accordance with example embodiments.

Figure 4:
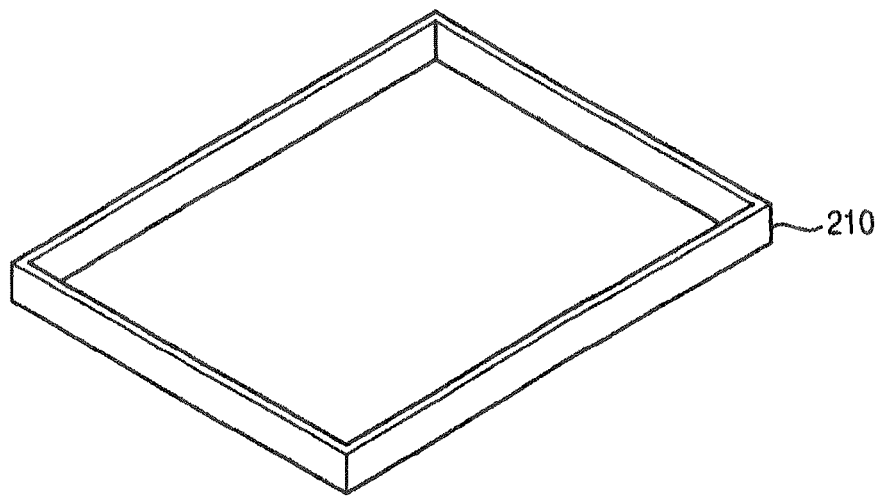
FIGS. 4 through 7 are perspective views illustrating a method of manufacturing an organic light emitting display device.

In reference to FIG. 4, a first cover 210 may be provided. The first cover 210 may correspond to a rear cover positioned behind a display panel 230 (see FIG. 6). The first cover 210 may be formed using a material having a relatively high strength. For example, the first cover 210 may be formed using stainless steel, magnesium, aluminum, nickel, etc. In some example embodiments, the first cover 210 may be formed using a flexible material. For example, the first cover 210 may be formed using polyimide-based resin, acryl-based resin, polyacrylate-based resin, polycarbonate-based resin, polyether-based resin, sulfonic acid-based resin, polyethyleneterephthalate-based resin, etc.

Figure 5:
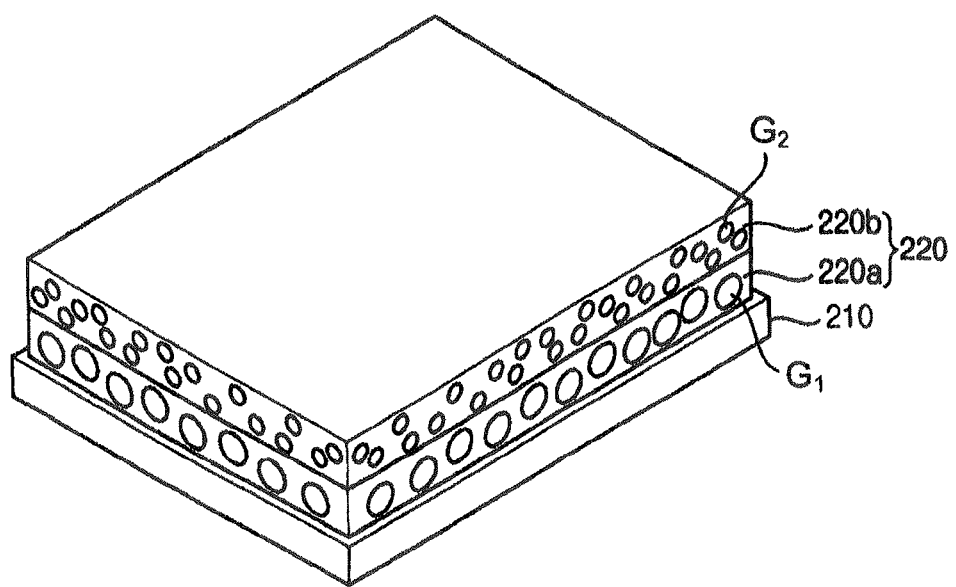

In reference to FIG. 5, a protection member 220 including at least one layer having a plurality of pores may be formed on the first cover 210. The protection member 220 may have a configuration substantially the same as or substantially similar to that of the protection member 120 described with reference to FIG. 1.

Hereinafter, a method of forming the protection member 220 will be described.

Figure 8:
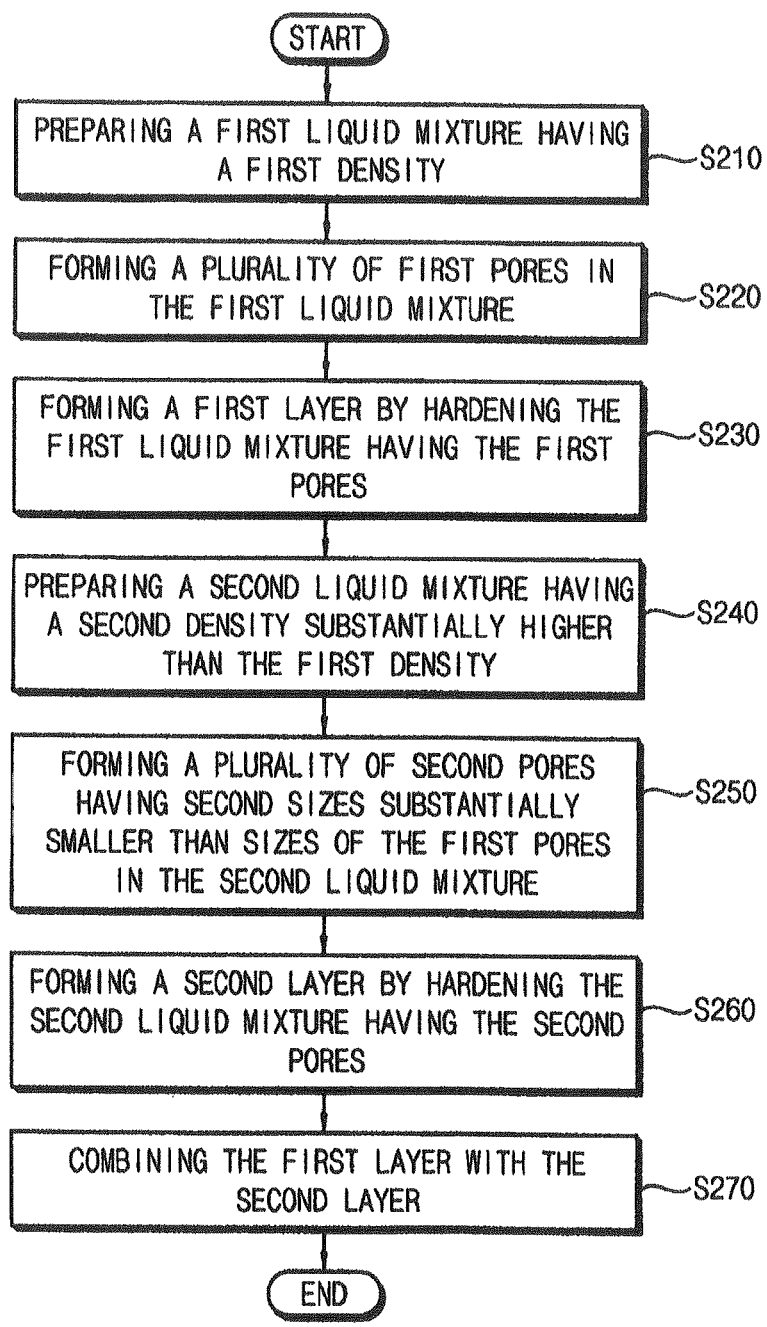
FIG. 8 a flow chart illustrating a method of manufacturing a protection member of an organic light emitting display device in accordance with example embodiments.

FIG. 8 a flow chart illustrating the method of manufacturing the protection member 220 of an organic light emitting display device in accordance with example embodiments.

Figure 6:
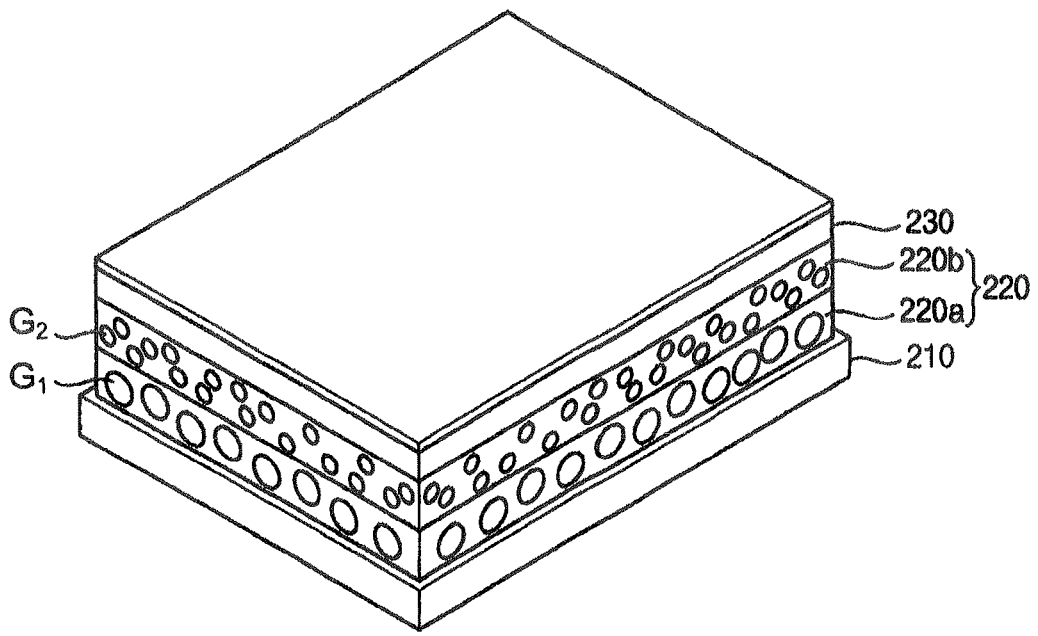

In reference to FIGS. 6 and 8, a first liquid mixture having a first density may be prepared (step S210), and then a plurality of first pores $G_1$ may be formed in the first liquid mixture by injecting a first non-reactive gas into the first liquid mixture (step S220). For example, the first liquid mixture may include silicon-based resin, rubber-based resin, acrylic-based resin, urethane-based resin, etc. These may be used alone or in a combination thereof. The first reactive gas may include a nitrogen gas, an argon (Ar) gas, a carbon dioxide ($CO_2$) gas.

A first layer 220a may be formed by hardening the first liquid mixture having the first pores $G_1$ (step S230). For example, the first liquid mixture may be hardened by thermal treatment process, a ultra violet light irradiation process, a laser beam irradiation process, etc.

A second liquid mixture having a second density substantially higher than the first density may be prepared (step S240), and then a plurality of second pores $G_2$ may be generated in the second liquid mixture by injecting a second non-reactive gas into the second liquid mixture (step S250). For example, the second liquid mixture may include silicon-based resin, rubber-based resin, acrylic-based resin, urethane-based resin, etc. These may be used alone or in a combination thereof. The second reactive gas may include a nitrogen gas, an argon gas, a carbon dioxide gas, etc. In example embodiments, the second pores $G_2$ may have sizes substantially smaller than those of the first pores $G_1$.

A second layer 220b may be formed by hardening the second liquid mixture having the second pores $G_2$ (step S260), and then the first layer 220a may be combined with the second layer 220b (step S270). Accordingly, the protection member 220 may be formed on the first cover 210. The second layer 220b may be obtained by a thermal treatment process, a UV irradiation process, a laser beam irradiation process, etc. In example embodiments, the protection member 220 may include the first layer 220a having the plurality of first pores $G_1$ and the second layer 220b having the plurality of second pores $G_2$.

In example embodiments, the first pores $G_1$ may be substantially irregularly dispersed in the first layer 220a, and also the second pores $G_2$ may be substantially irregularly dispersed in the second layer 320b. The first layer 220a may have a first density substantially lower than a second density of the second layer 220b, and thus a distance between the first cover 210 and the display panel 230 may be efficiently controlled by the first layer 220a. Hence, a tolerance generated in processes for manufacturing the organic light emitting display device may reduced or removed by the first layer 220a of the protection member 220. Further, the second layer 220b of the protection member 220 may have the relatively high second density, and thus external impacts applied to the display panel 230 may be reduced or absorbed by the second layer 220b.

The protection member 220 illustrated in FIG. 6 may have a configuration substantially the same as or substantially similar to those of the protection member 120 described with reference to FIG. 1. However, the configuration of the protection member 220 is not limited thereto. For example, the protection members 121, 122, 123, 124 and 125 respectively illustrated in FIGS. 2A through 2E may be formed on the first cover 210 by processes substantially the same as or substantially similar to the processes described with reference to FIG. 8.

In some example embodiments, the plurality of first pores may be generated in a first liquid mixture, and then a plurality of first thermally conductive filers may be dispersed in the first liquid mixture. In this case, the first thermally conductive filers may include metal particles. Examples of the metal particles for the first thermally conductive filers may include cupper, aluminum, nickel, silver, iron, zinc, gold, platinum, chrome, cadmium, tungsten, etc. A first layer including the first thermally conductive filers and the first pores may be formed by hardening the first liquid mixture. Further, the plurality of second pores having sizes substantially smaller than those of the first pores may be additionally formed in the second liquid mixture, and then a plurality of second thermally conductive filers may be dispersed in the second liquid mixture. Here, the second thermally conductive filers and the first thermally conductive filers may include a substantially the same material. A second layer may be formed by hardening the second liquid mixture including the second thermally conductive filers and the second pores. Meanwhile, a plurality of third pores having sizes substantially the same as those of the first pores may be formed in a third liquid mixture, and then a plurality of third thermally conductive filers may be dispersed in the third liquid mixture. The third liquid mixture may include silicon-based resin, rubber-based resin, acrylic-based resin and urethane-based resin. Each of the third thermally conductive filers and the first thermally conductive filers may include a substantially the same material. A third layer may be formed by hardening the third liquid mixture including the third thermally conductive filers and the third pores. After the first layer and the second layer are combined with each other, the third layer may be attached on the second layer, so that a protection member may be obtained. In some example embodiments, the sizes of the second pores in the second layer may be substantially larger than the sizes of the first pores in the first layer, and the sizes of the third pores in the third layer may be substantially the same as the sizes of the first pores in the first layer.

Figure 7:
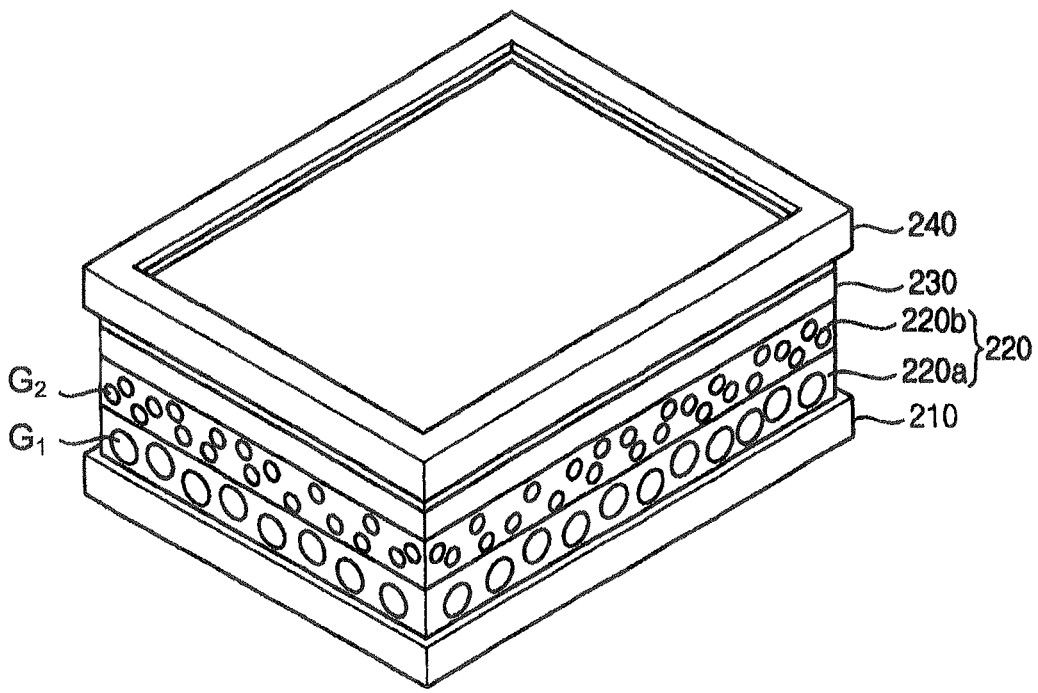

In reference to FIG. 7, the display panel 230 may be formed on the protection member 220. The display panel 230 may include substrates, switching elements, insulation layers, electrodes, organic light emitting structures, etc. In some example embodiments, the display panel may include liquid crystal structures instead of the organic light emitting structures.

As illustrated in FIG. 8, a second cover 240 may be formed on the display panel 230. The second cover 240 may be positioned in front of the display panel 230, and may be combined with the first cover 210 by interposing the display panel 230 therebetween. In example embodiments, the second cover 240 may be formed using a material having a relatively high strength. For example, the second cover 240 may be formed using stainless steel, magnesium, aluminum, nickel, etc. In some example embodiments, the second cover 240 may be formed using a flexible material. For example, the second cover 240 may be formed using polyimide-based resin, acryl-based resin, polyacrylate-based resin, polycarbonate-based resin, polyether-based resin, sulfonic acid-based resin, polyethyleneterephthalate-based resin, etc.

Figure 9:
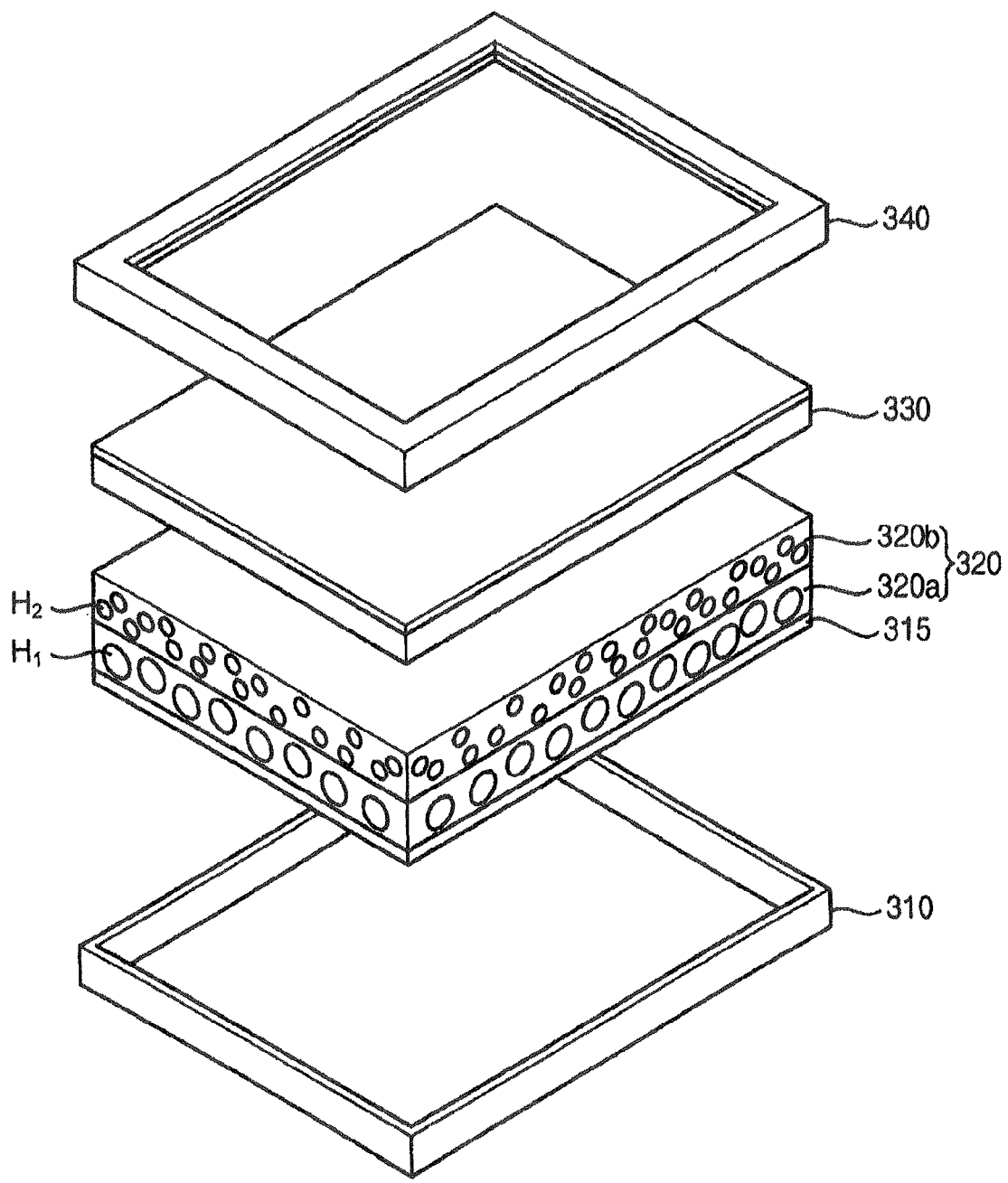
FIG. 9 is an exploded perspective view illustrating an organic light emitting display device in accordance with some example embodiments.

FIG. 9 is an exploded perspective view illustrating an organic light emitting display device in accordance with some example embodiments. The organic light emitting display device 300 illustrated in FIG. 9 may have a configuration substantially the same as or substantially similar to that of the organic light emitting display device 100 described with reference to FIG. 1 except an electromagnetic wave shielding member 315.

In reference to FIG. 9, an organic light emitting display device 300 may include a first cover 310, an electromagnetic wave shielding member 315, a protection member 320, a display panel 330, a second cover 340, etc.

The first cover 310 may be disposed behind the display panel 330 (i.e., beneath the display panel 330). The first cover 310 may receive the display panel 330 therein. The first cover 310 may include a material having a relatively high strength. Alternatively, the first cover 310 may include a flexible material.

The electromagnetic wave shielding member 315 may be disposed between the first cover 310 and the display panel 330. The electromagnetic wave shielding member 315 may shield an electromagnetic wave generated from the display panel 330 in an operation of the organic light emitting display device 300. For example, the electromagnetic wave shielding member 315 may be coated on a bottom surface of the protection member 320. In example embodiments, the electromagnetic wave shielding member 315 may include a conductive metal layer containing cupper, aluminum, nickel, silver, iron, zinc, gold, platinum, chrome, cadmium and/or tungsten. These may be used alone or in a combination thereof.

The protection member 320 may be disposed on the electromagnetic wave shielding member 315. In example embodiments, the protection member 320 may include a plurality of layers. Here, each of the layers may have a plurality of pores, respectively. As illustrated in FIG. 9, the protection member 320 may include a first layer 320a having a plurality of first pores $H_1$ and a second layer 320b having a plurality of second pores $H_2$. The first pores $H_1$ and the second pores $H_2$ may be substantially irregularly dispersed in the first layer 320a and the second layer 320b, respectively. For example, the first layer 320a having the first pores $H_1$ may reduce or remove a tolerance generated between the first cover 310 and the display panel 330, and the second layer 320b having the second pores $H_2$ may reduce or absorb external impacts applied to the display panel 330.

Although the protection member 320 illustrated in FIG. 9 may have a configuration substantially the same as or substantially similar to that of the protection member 120 described with reference to FIG. 1, the configuration of the protection member 320 may not be limited thereto. For example, the organic light emitting display device 300 may include the protection members 121, 122, 123, 124 and 125 illustrated in FIGS. 2A through 2E, respectively.

The display panel 330 may be disposed on the protection member 320. The display panel 330 may have a configuration substantially the same as or substantially similar to that of the display panel 130 described with reference to FIG. 3. Alternatively, the display panel 330 may include a liquid crystal layer interposed between electrodes thereof.

The second cover 340 may be disposed on in front of the display panel 330 (i.e., a front face of the display panel 330).

The second cover 340 may include a material having a relatively high strength. Alternatively, the second cover 340 may include a flexible material.

FIGS. 10 through 13 are perspective views illustrating a method of manufacturing an organic light emitting display device in accordance with some example embodiments.

Figure 10:
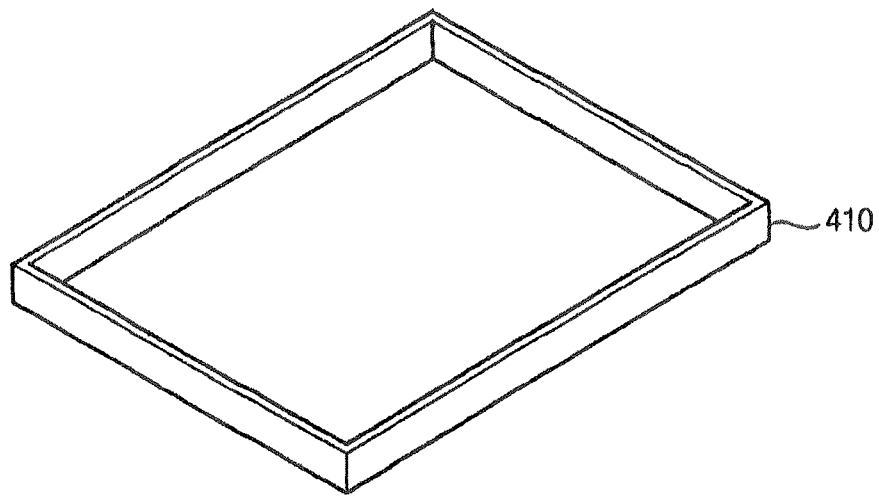
FIGS. 10 through 13 are perspective views illustrating a method of manufacturing an organic light emitting display device in accordance with some example embodiments.

In reference to FIG. 10, a first cover 410 may be provided. The first cover 410 may be formed using a material having a relatively high strength or a flexible material.

Figure 11:
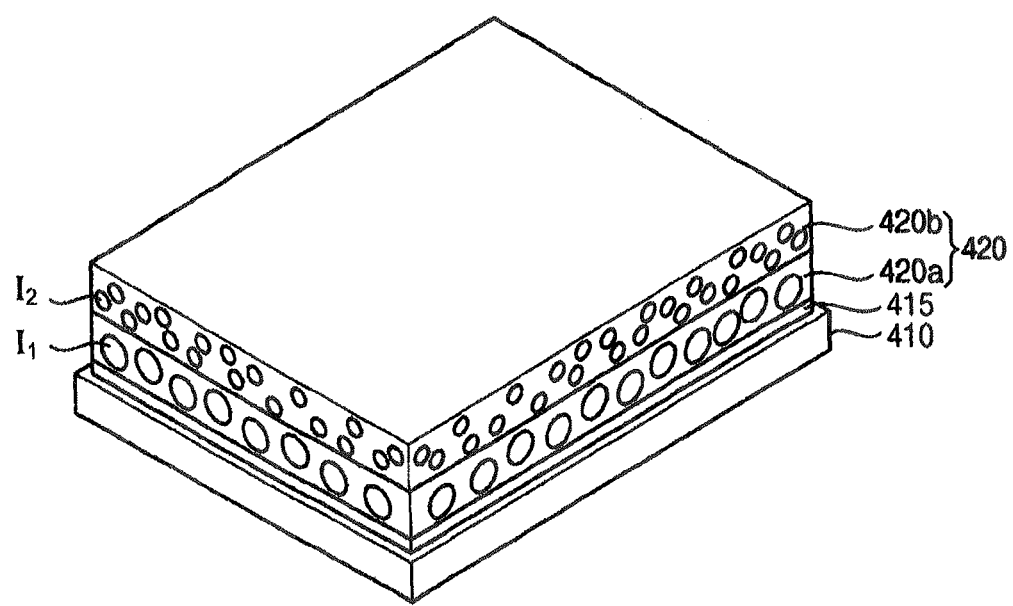
Figure 14:
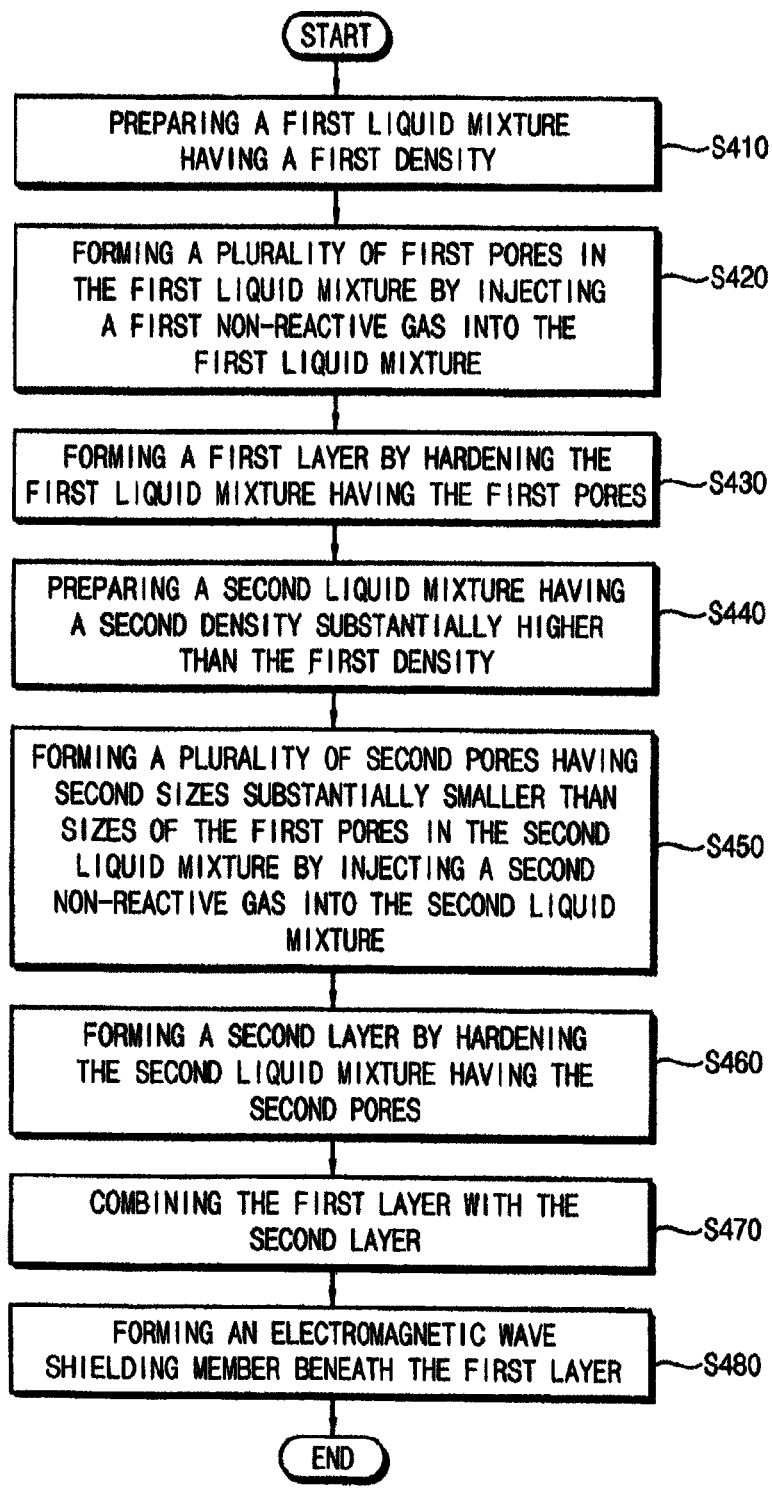
FIG. 14 is a flow chart illustrating a method of manufacturing a protection member of an organic light emitting display device in accordance with some example embodiments.

In reference to FIG. 11, an electromagnetic wave shielding member 415 and a protection member 420 may be formed on the first cover 410. FIG. 14 is a flow chart illustrating a method of manufacturing a protection member of an organic light emitting display device in accordance with some example embodiments.

Figure 12:
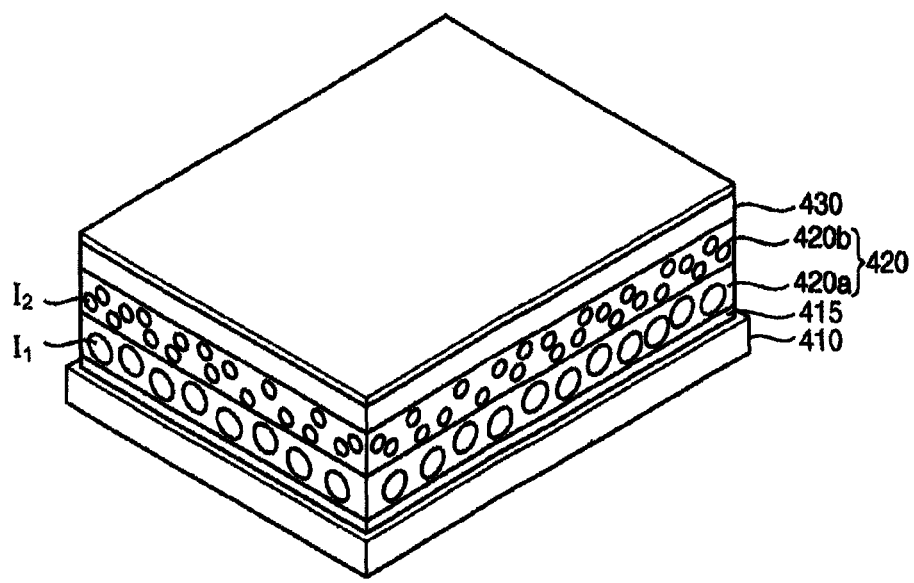

In reference to FIGS. 12 and 14, a first liquid mixture having a first density may be prepared using silicon-based resin, rubber-based resin, acrylic-based resin and urethane-based resin (step S410). Then a plurality of first pores $I_1$ may be formed in the first liquid mixture by providing a first non-reactive gas into the first liquid mixture (step S420). A first layer 420a may be obtained by hardening the first liquid mixture having the first pores $I_1$ (step S430). A second liquid mixture having a second density substantially higher than the first density may be prepared using silicon-based resin, rubber-based resin, acrylic-based resin, urethane-based resin (step S440). A plurality of second pores $I_2$ may be generated in the second liquid mixture by injecting a second non-reactive gas into the second liquid mixture (step S450). A second layer 420b may be formed by hardening the second liquid mixture having the second pores $I_2$ (step S460), and then the first layer 420a and the second layer 420b may be combined with each other (step S470). Accordingly, the protection member 420 may be obtained. The electromagnetic wave shielding member 415 may be formed beneath the first layer 420a (i.e., a rear face of the first layer 410a).

In example embodiments, the electromagnetic wave shielding member 415 may be coated beneath the protection member 420 by a sputtering process. The electromagnetic wave shielding member 415 may include a conductive metal layer. Examples of the conductive metal layer for the electromagnetic wave shielding member 415 may include cupper, aluminum, nickel, silver, iron, zinc, gold, platinum, chrome, cadmium, tungsten, etc. These may be used alone or in a combination thereof. The electromagnetic wave shielding member 415 may block an electromagnetic wave generated from the display panel 430 (see FIG. 12) to protect a user.

The protection member 420 illustrated in FIG. 12 may have a configuration substantially the same as or substantially similar to that of the protection member 120 described with reference to FIG. 1. However, the configuration of the protection member 420 may not limited thereto. For example, the organic light emitting display device 400 may include the protection members 121, 122, 123, 124 and 125 illustrated in FIGS. 2A to 2E, respectively.

In reference to FIG. 12, the display panel 430 may be formed on the protection member 420. The display panel 430 may have a configuration substantially the same as or substantially similar to that of the display panel 130 described with reference to FIG. 1. The display panel 430 may include an organic light emitting structure or a liquid crystal structure.

Figure 13:
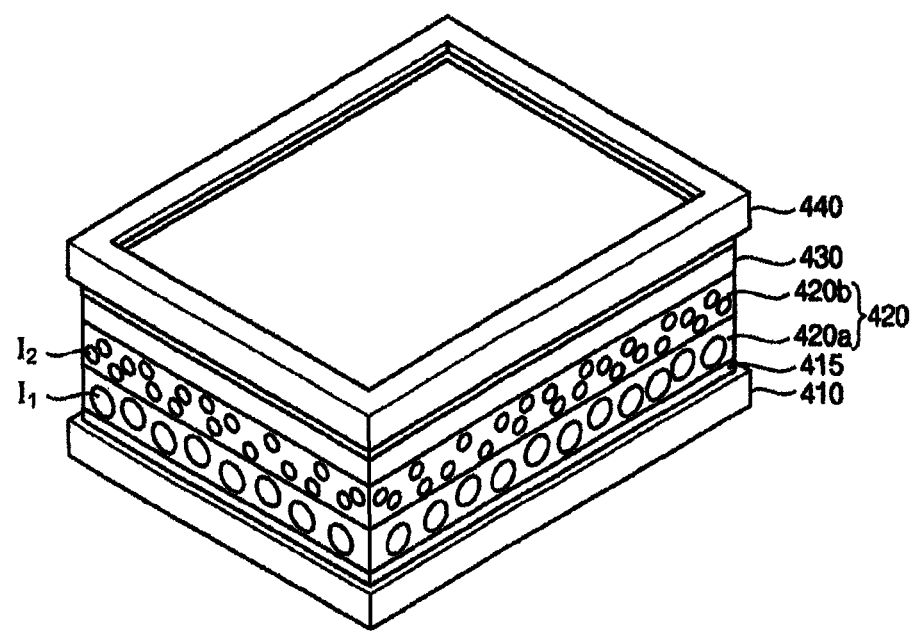

As illustrated in FIG. 13, a second cover 440 may be formed on the display panel 430. The second cover 240 may be combined with the first cover 210 by interposing the display panel 430 therebetween. The second cover 240 may be formed using a material having a relatively high strength or a flexible material.

Example embodiments of the invention may be employed in any electronic device including a display device such as an organic light emitting display device to reduce external impacts and a tolerance generated in manufacturing processes. For example, the organic light emitting display device according to embodiments may be used in a notebook computer, a laptop computer, a digital camera, a video camcorder, a cellular phone, a smart phone, a smart pad, a portable multimedia player (PMP), a personal digital assistant (PDA), a MP3 player, a navigation system, a television, a computer monitor, a game console, a video phone, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting display device comprising:
   a first cover;
   a protection member disposed on the first cover, the protection member including a plurality of layers having pores;
   a display panel disposed on the protection member; and
   a second cover disposed on the protection member.

2. The organic light emitting display device of claim 1, wherein the protection member includes:
   a first layer having a plurality of first pores, wherein each of the first pore has a first size; and
   a second layer disposed on the first layer, the second layer including a plurality of second pores, wherein each of the second pores has a second size different from the first size.

3. The organic light emitting display device of claim 2, wherein the first layer reduces a tolerance between the first cover and the display panel generated in manufacturing of the organic light emitting display device, and the second layer reduces an external impact applied to the display panel.

4. The organic light emitting display device of claim 2, the protection member additionally includes a plurality of thermally conductive filers dispersed in the first layer and the second layer.

5. The organic light emitting display device of claim 2, the protection member additionally includes a third layer having a plurality of third pores, wherein the third layer disposed on the second layer or beneath the first layer.

6. The organic light emitting display device of claim 5, wherein each of the third pores has a third size the same as the first size.

7. The organic light emitting display device of claim 5, wherein the protection member additionally includes a plurality of thermally conductive filers dispersed in the third layer.

8. The organic light emitting display device of claim 1, wherein the protection member includes at least one selected from the group consisting of silicon-based resin, rubber-based resin, acrylic-based resin and urethane-based resin.

9. The organic light emitting display device of claim 1, further comprising an electromagnetic wave shielding member disposed between the first cover and the protection member, wherein the electromagnetic wave shielding member blocks an electromagnetic wave generated from the display panel.

10. The organic light emitting display device of claim 9, wherein the electromagnetic wave shielding member comprises a conductive metal layer including at least one selected from the group consisting of copper (Cu), aluminum (Al), nickel (Ni), silver (Ag), iron (Fe), zinc (Zn), gold (Au), platinum (Pt), chrome (Cr), cadmium (Cd) and tungsten (W).

11. The organic light emitting display device of claim 1, wherein the protection member additionally includes a plurality of thermally conductive filers dispersed in the plurality of layers, respectively, and wherein the thermally conductive filers emit heat generated by and transferred from the display panel to an exterior of the display device.

12. The organic light emitting display device of claim 11, wherein each of the thermally conductive filers comprises metal particles including at least one selected from the group consisting of copper (Cu), aluminum (Al), nickel (Ni), silver (Ag), iron (Fe), zinc (Zn), gold (Au), platinum (Pt), chrome (Cr), cadmium (Cd) and tungsten (W).

13. A method of manufacturing an organic light emitting display device, the method comprising:
providing a first cover;
forming a protection member having a plurality of layers on the first cover, the plurality of layers having a plurality of pores;
forming a display panel on the protection member; and
forming a second cover on the display panel.

14. The method of claim 13, wherein the formation of the protection member comprises:
preparing a first liquid mixture including at least one selected from the group consisting of silicon-based resin, rubber-based resin, acrylic-based resin and urethane-based resin;
forming a plurality of first pores in the first liquid mixture by injecting a first non-reactive gas into the first liquid mixture;
forming a first layer by hardening the first liquid mixture having the first pores;
preparing a second liquid mixture including at least one selected from the group consisting of silicon-based resin, rubber-based resin, acrylic-based resin and urethane-based resin;
forming a plurality of second pores having second sizes different from sizes of the first pores in the second liquid mixture by injecting a second non-reactive gas into the second liquid mixture;
forming a second layer by hardening the second liquid mixture having the second pores; and
combining the first layer with the second layer.

15. The method of claim 14, wherein the formation of the protection member comprises:
dispersing first thermally conductive filers in the first liquid mixture;
forming the first layer by hardening the first liquid mixture including the first thermally conductive filers and the first pores;
dispersing second thermally conductive filers in the second liquid mixture; and
forming the second layer by hardening the second liquid mixture including the second thermally conductive filers and the second pores.

16. The method of claim 14, wherein the formation of the protection member comprises:
preparing a third liquid mixture including at least one selected from the group consisting of silicon-based resin, rubber-based resin, acrylic-based resin and urethane-based resin;
forming a plurality of third pores having sizes the same as the sizes of the first pores in the third liquid mixture by injecting a third non-reactive gas into the third liquid mixture;
forming a third layer by hardening the third liquid mixture having the third pores; and
attaching the third layer on the second layer.

17. The method of claim 14, wherein the formation of the protection member comprises:
preparing a third liquid mixture including at least one selected from the group consisting of silicon-based resin, rubber-based resin, acrylic-based resin and urethane-based resin;
forming a plurality of third pores in the third liquid mixture by injecting a third non-reactive gas into the third liquid mixture;
forming a third layer by hardening the third liquid mixture having the third pores; and
attaching the third layer beneath the first layer.

18. The method of claim 17, wherein the formation of the protection member comprises:
dispersing third thermally conductive filers in the third liquid mixture; and
forming the third layer by hardening the third liquid mixture including the third thermally conductive filers and the third pores.

19. The method of claim 13, further comprising forming an electromagnetic wave shielding member between the first cover and the protection member, wherein the electromagnetic wave shielding member is coated beneath the protection member.

20. The method of claim 19, wherein the electromagnetic wave shielding member comprises a conductive metal layer including at least one selected from the group consisting of copper, aluminum, nickel, silver, iron, zinc, gold, platinum, chrome, cadmium and tungsten.

* * * * *